United States Patent
Triyoso et al.

(10) Patent No.: US 12,550,696 B2
(45) Date of Patent: Feb. 10, 2026

(54) PATTERNING WITH SELF-ASSEMBLED MONOLAYER

(71) Applicant: Tokyo Electron Limited, Tokyo (JP)

(72) Inventors: Dina H. Triyoso, Albany, NY (US); Robert D. Clark, Fremont, CA (US); Hirokazu Aizawa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 559 days.

(21) Appl. No.: 17/894,778

(22) Filed: Aug. 24, 2022

(65) Prior Publication Data
US 2023/0253250 A1    Aug. 10, 2023

Related U.S. Application Data

(60) Provisional application No. 63/306,590, filed on Feb. 4, 2022.

(51) Int. Cl.
*H01L 21/768* (2006.01)

(52) U.S. Cl.
CPC .. *H01L 21/76897* (2013.01); *H01L 21/76811* (2013.01); *H01L 21/76816* (2013.01); *H01L 21/76831* (2013.01)

(58) Field of Classification Search
CPC ......... H01L 21/76897; H01L 21/76811; H01L 21/76816; H01L 21/76831
See application file for complete search history.

(56) References Cited

U.S. PATENT DOCUMENTS

| | | | |
|---|---|---|---|
| 9,837,314 B2 | 12/2017 | Smith et al. | |
| 10,068,764 B2 | 9/2018 | Tapily et al. | |
| 10,777,411 B1* | 9/2020 | Nguyen | H01L 21/02118 |
| 11,164,781 B2 | 11/2021 | Sun et al. | |
| 2019/0295891 A1 | 9/2019 | Clark et al. | |
| 2019/0363008 A1* | 11/2019 | Gstrein | H01L 21/76877 |
| 2021/0380836 A1* | 12/2021 | Fuse | B05D 1/60 |

OTHER PUBLICATIONS

Nguyen et al., "Selective deposition of AlOx for Fully Aligned Via in nano Cu interconnects," 2021 IEEE International Interconnect Technology Conference(IITC), Jul. 6-9, 2021, 2 pages.

* cited by examiner

*Primary Examiner* — Thanhha S Pham
(74) *Attorney, Agent, or Firm* — Slater Matsil, LLP

(57) ABSTRACT

A method of processing a substrate that includes: selectively depositing a self-assembled monolayer (SAM) on a metal line of the substrate, the SAM being in contact with the metal line, a surface of the substrate further including a first dielectric material that surrounds the metal line; selectively depositing a second dielectric material over the first dielectric material; forming a dielectric layer by depositing a third dielectric material over the second dielectric material and the SAM; and patterning the dielectric layer.

20 Claims, 9 Drawing Sheets

PATTERNING WITH SELF-ASSEMBLED MONOLAYER

CROSS-REFERENCE TO RELATED APPLICATIONS

This application claims the benefit of U.S. Provisional Application No. 63/306,590, filed on Feb. 4, 2022, which application is hereby incorporated herein by reference.

TECHNICAL FIELD

The present invention relates generally to methods of processing a substrate, and, in particular embodiments, to fully self-aligned vias (FSAV) with self-assembled monolayer (SAM).

BACKGROUND

Semiconductor devices typically are fabricated by sequentially depositing insulating or dielectric layers, conductive layers, and other layers of material over a semiconductor substrate, and patterning the various layers using lithography to form circuit components and elements on the semiconductor substrate. The semiconductor industry continues to increase the density of electronic components (e.g., transistors, diodes, resistors, capacitors, etc.) by continual reductions in minimum feature size, allowing more components to be integrated into a particular area.

As scaling of semiconductor devices continues to smaller and smaller features, manufacturing steps become more complex and issues such as voids and edge placement errors arise. The use of selective film deposition processes is becoming more critical to simplify manufacturing steps and provide more process margins that translate into higher yield.

SUMMARY

In accordance with an embodiment of the present invention, a method of processing a substrate that includes: selectively depositing a self-assembled monolayer (SAM) on a metal line of the substrate, the SAM being in contact with the metal line, a surface of the substrate further including a first dielectric material that surrounds the metal line; selectively depositing a second dielectric material over the first dielectric material; forming a dielectric layer by depositing a third dielectric material over the second dielectric material and the SAM; and patterning the dielectric layer.

In accordance with an embodiment of the present invention, a method of processing a substrate that includes: loading a substrate in a processing chamber, the substrate including a first metal and a first dielectric material; rotating the substrate; while rotating the substrate, dispensing a solution containing self-assembled monolayer (SAM) molecules onto the substrate to deposit a SAM on the first metal, the SAM being in physical contact with the first metal; dispensing a rinsing solution onto the substrate; exposing the substrate to a vapor containing a second dielectric precursor to deposit a second dielectric material over the first dielectric material; and exposing the substrate to another vapor containing a third dielectric precursor to deposit a third dielectric material over the second dielectric material and the SAM, the third dielectric precursor and the second dielectric precursor having different compositions.

In accordance with an embodiment of the present invention, a method of processing a substrate that includes: selectively depositing a self-assembled monolayer (SAM) on a metal of the substrate to physically contact the SAM with the metal, the substrate including the metal and a first dielectric material; selectively depositing a second dielectric material over the first dielectric material; depositing a diffusion barrier layer over the second dielectric material and the SAM, the diffusion barrier layer including a third dielectric material having a different composition from the second dielectric material; forming a dielectric layer by depositing a fourth dielectric material over the diffusion barrier layer, the fourth dielectric material having a different composition than the third dielectric material; and patterning the dielectric layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3I illustrate, through schematic cross-sectional views of a substrate, a method of processing the substrate in accordance with various embodiments, wherein FIG. 3A illustrates the incoming substrate comprising a metal and a first dielectric material, FIG. 3B illustrates the substrate after removing a surface oxide to expose the metal, FIG. 3C illustrates the substrate after selectively depositing a self-assembled monolayer (SAM) on the metal, FIG. 3D illustrates the substrate after depositing a second dielectric material on the first dielectric material, where the SAM hinders deposition of the second dielectric material on the metal, FIG. 3E illustrates the substrate after forming a layer stack comprising a interlayer dielectric (ILD) for subsequent patterning over the substrate; FIG. 3F illustrates the substrate after a first pattern transfer etch, FIG. 3G illustrates the substrate after a second pattern transfer etch, FIG. 3H illustrates the substrate after removing the SAM, and FIG. 3I illustrates the substrate after metallization;

FIG. 4A-4D illustrate example process flow diagrams in accordance with various embodiments, wherein FIG. 4A illustrates an embodiment, FIG. 4B illustrates steps for patterning an interlayer dielectric (ILD) after forming the SAM in accordance with an embodiment, FIG. 4C illustrates another embodiment, and FIG. 4D illustrates yet another embodiment.

DETAILED DESCRIPTION OF ILLUSTRATIVE EMBODIMENTS

This application relates to a method of processing a substrate, more particularly to patterning with self-assembled (SAM) in semiconductor manufacturing. Techniques herein include methods of patterning substrates such as for back end of line (BEOL) metallization processes. For example, techniques herein enable fully self-aligned vias (FSAV) and lines. As the scaling of advanced semiconductor devices and manufacturing methods thereof continues, selective deposition is needed to simplify manufacturing steps and provide more process margin which could translate to higher yield. In FSAV formation used for various logic and memory applications, for example, selective dielectric-on-dielectric (DoD) deposition with selective SAM coating may be used to define a structure for interconnects. The SAM coated surface prevents the dielectric deposition and thereby enables the dielectric to be deposited only on the surface not coated with the SAM. However, currently available methods for FSAV formation involve many steps including SAM removal and dielectric diffusion barrier layer deposition. Therefore, new methods for FSAV patterning with simplified process flows may be desired. Techniques herein include a FSAV technique that uses a SAM as a diffusion barrier layer, thereby eliminating the need for an additional barrier layer and SAM removal prior to subsequent steps. Accordingly, the methods described in this disclosure may advantageously simplify the process flow for forming fully self-aligned vias (FSAV).

In the following, an example spin-coating processing system for selective self-assembled monolayer (SAM) formation is first described referring to FIG. 1 in accordance with an embodiment. A simplified structure of a SAM molecule is illustrated in FIG. 2. In FIG. 3A-3I, a method of selective SAM formation, dielectric deposition, and FSAV formation is described in accordance with various embodiments. Example process flow diagrams are illustrated in FIG. 4A-4D. All figures in this disclosure are drawn for illustration purpose only and not to scale, including the aspect ratios of features. Although this disclosure primarily describes the methods for application in FSAV formation process, the methods can be applied in other fabrication processes where selective dielectric deposition may be used.

Figure 1:
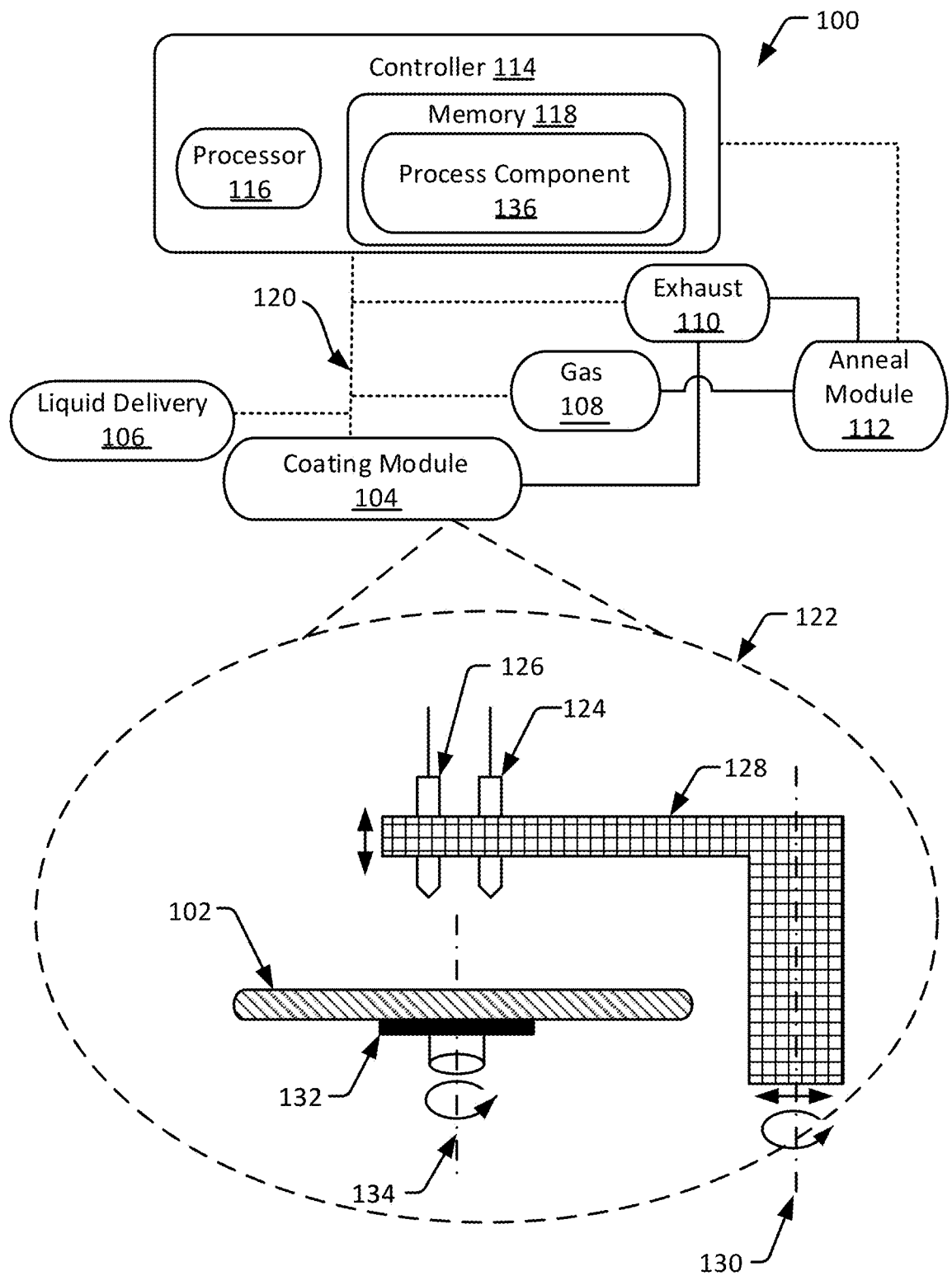
FIG. 1 illustrates a representative embodiment of a spin-coating processing system that includes a cross-sectional illustration of a coating module of the spin-coating processing system.
Figure 2:
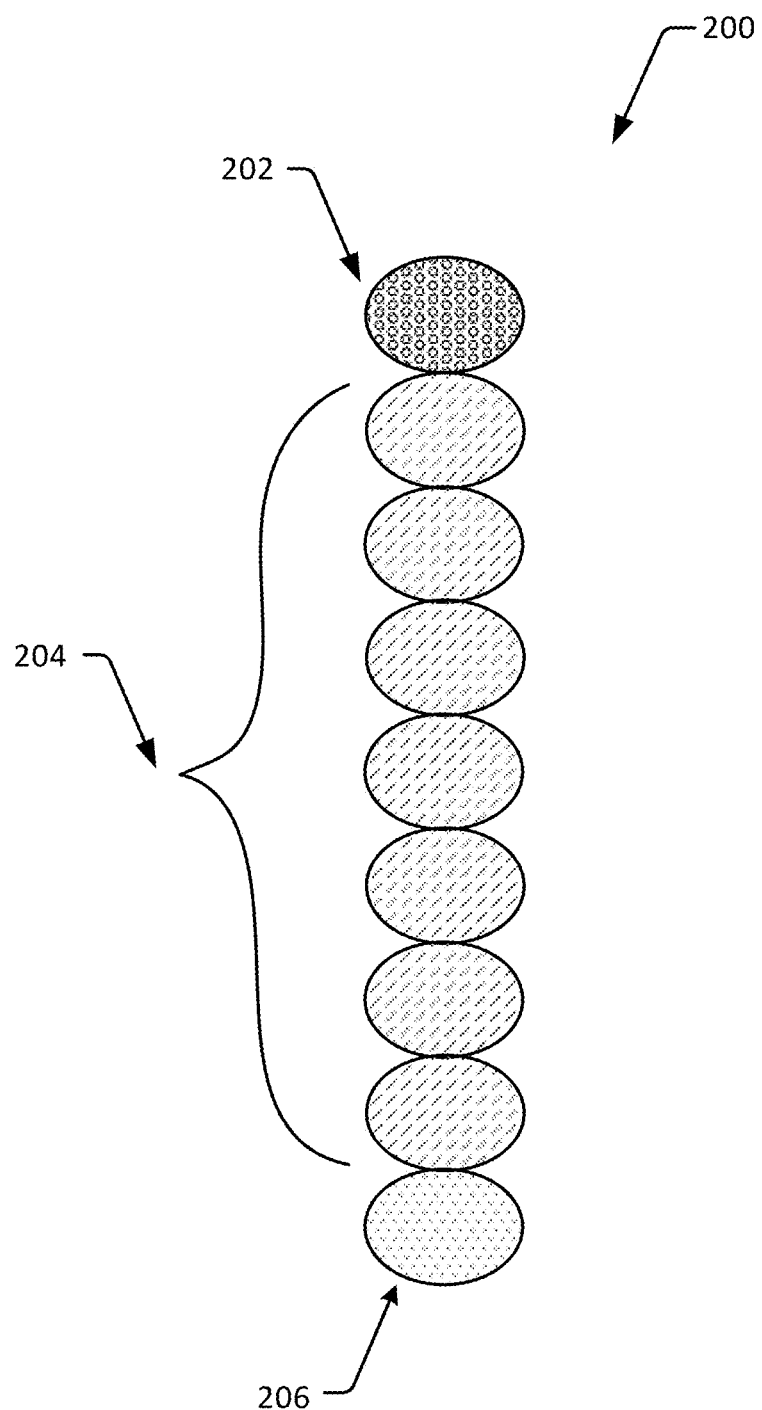
FIG. 2 illustrates a representative embodiment of a group of a self-assembled monolayer (SAM)

FIG. 1 illustrates a representative embodiment of a spin-coating processing system that includes a cross-sectional illustration of a coating module of the spin-coating processing system.

FIG. 1 depicts a spin-coating processing system 100 for dispensing chemicals onto a substrate 102 using a coating module 104 that is in fluid communication with a liquid delivery system 106 that may dispense one or more types of liquid chemicals. The system 100 may also include a gas delivery system 108 that may provide gas to the coating module 104 that may be removed via an exhaust system 110. A liquid drain (not shown) may also be incorporated into the exhaust system to remove liquids from the coating module 104. The system 100 may also include an anneal module 112 that may bake or apply light radiation to the substrate 102 after the chemicals have been dispensed. A controller 114 may be used control the components of the system 100 using an electrical communication network that may send or receive computer-executable instructions or electrical signals between the system 100 components. The controller 114 may include one or more computer processors 116 and memory 118 that may store computer-executable instructions that may be executed by the computer processors or other logic/processing devices. The controller 114 may store process component 136 than can include a recipe or process condition routines that may be implemented by controlling or directing the components of the system 100 to obtain certain conditions within the coating module 104 and/or the anneal module 112. Communication between the components may be implemented through processing and electrical communication techniques known to a person of ordinary skill in the art, as represented by the dashed lines 120.

The computer processors 116 may include one or more processing cores and are configured to access and execute (at least in part) computer-readable instructions stored in the one or more memories. The one or more computer processors 116 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The computer processors 116 may also include a chipset(s) (not shown) for controlling communications between the components of the system 100. In certain embodiments, the computer processors may be based on Intel™ architecture or ARM™ architecture and the processor(s) and chipset may be from a family of Intel™ processors and chipsets. The one or more computer processors may also include one or more application-specific integrated circuits (ASICs) or application-specific standard products (ASSPs) for handling specific data processing functions or tasks.

The memory 118 may include one or more non-transitory computer-readable storage media ("CRSM"). In some embodiments, the one or more memories may include non-transitory media such as random access memory ("RAM"), flash RAM, magnetic media, optical media, solid state media, and so forth. The one or more memories may be volatile (in that information is retained while providing power) or non-volatile (in that information is retained without providing power). Additional embodiments may also be provided as a computer program product including a non-transitory machine-readable signal (in compressed or uncompressed form). Examples of machine-readable signals include, but are not limited to, signals carried by the Internet or other networks. For example, distribution of software via the Internet may include a non-transitory machine-readable signal. Additionally, the memory may store an operating system that includes a plurality of computer-executable instructions that may be implemented by the processor to perform a variety of tasks to operate the system 100.

FIG. 1 also includes a representative illustration 122 of one embodiment of the coating module 104 that may dispense chemicals onto the substrate 102. The system 100 may be used to dispense one or more liquid chemicals that may be distributed across the substrate 102 be either rotating the substrate 102, translating the substrate 102, or rotating or translating the locations of the liquid dispensers. The liquid dispensers 124, 126, may disposed above the substrate 102 may be moved across or around to any position above or adjacent to the substrate 102 using the positioning mechanism 128. In the embodiment in FIG. 1, the positioning mechanism 128 may move forward and backward in a horizontal and/or vertical plane as indicated by the arrows adjacent to the positioning mechanism 128. The positioning mechanism 128 may also be rotated around the vertical axis 130 of the positioning mechanism 128. The positioning mechanism 128 may dispense chemicals at discrete locations around the substrate 102 or they may be dispensed as the positioning mechanism 128 moves across the substrate 102. The chemicals may be disposed in a continuous or non-continuous manner onto the substrate. The chemicals may be dispensed one at a time in several movements across the substrate 102 or the chemicals may be dispensed at the same location, but at different times.

The substrate 102 may be secured to a rotating chuck 132 that supports the substrate 102 and may rotate the substrate 102 during the chemical dispensing. The substrate 102 may be rotated around the rotation axis 134 with up to speeds of 2200 revolutions per minute (rpm). The chemical dispense may occur before, during, and/or after the substrate 102 starts to rotate.

Prior to or after the chemical dispensing, the substrate 102 may be treated in the anneal module 112 that may heat the substrate 102 up to remove moisture from the substrate 102 prior to the chemical dispensing or to treat the film deposited on the substrate 102 by the coating module 104. The anneal module 112 may include, but is not limited to, a resistive heating element (not shown) that transfers heat via conduction to the substrate 102. In another embodiment, the anneal module 112 may include a radiation source (not shown) that exposes the substrate 102 to radiation. The radiation source may include, but is not limited to, an ultraviolet light (UV) source (not shown). The anneal module 112 may also heat the substrate 102 via convection by receiving heated gas from the gas delivery system 108. The anneal module 112 may also treat the substrate 102 with relatively inert gases, with respect to the substrate 102 or deposited film, to prevent chemical reactions with the ambient or surrounding environment (e.g., oxygen, moisture, etc.). The gases may also be used to remove gas or fluid that is out-gassed from the deposited film during the anneal treatment. The out-gassed chemicals may be removed by the exhaust system 110 that that removes the gases from the anneal module 112.

FIG. 2 illustrates a representative embodiment of a group of a self-assembled monolayer (SAM).

FIG. 2 is an illustration of a representative embodiment of a group of a self-assembled monolayer (SAM) molecule 200 that may be formed on the substrate 102. SAMs are widely known as surface modification agents and adhesion layers. The SAM molecule 200 shown in FIG. 2 is intended for illustrative purposes to explain the components of the SAM. In application, the SAM molecule 200 may be used with a plurality of SAM molecules 200 that arrange themselves in a systematic manner on the substrate 102. In brief, the plurality of SAM molecules 200 may form a three-dimensional crystalline or semi-crystalline structure on the surface of the substrate 102. The SAM molecule 200 may have a thickness of less than 1 nm. The SAM molecule 200 may include a chemical compound that includes a terminal group 202, a chain group 204, and bonding group 206. These groups may form the building blocks of the SAM molecule 200 and that the interactions between these groups and the substrate 102 may form a three-dimensional structure. The molecular self-assembly may due to a combination of van der Waals interactions, hydrophobic interactions, and/or molecule-substrate interactions that form highly ordered low-dimensional structures spontaneously on the substrate 102 or overlying films (not shown).

Broadly, the bonding group 206 may be coupled to or chemisorbed to the substrate 102. The bonding group 206 may be chemically attracted to the substrate 102 or to a film or layer on the substrate 102, such as a metal layer. However, the terminal group 202 and the chain group 204 may be not be coupled to or chemisorbed into the substrate 102, or at least not coupled in the same way as the bonding group 206. The chain group 204 and the terminal group 202 may assemble themselves as shown in FIG. 2. As a result of this selective assembly, the SAM molecule 200 may appear to stand on end with the bonding group 206 secured to the substrate 102 and the terminal group 202 and chain group 206 being tethered to the substrate 102 via the bonding group 206.

The SAM molecule 200 may be used for a variety of applications and the composition of the groups, or building blocks, may vary depending on the desired structure and the type of substrate 102. According to one embodiment, the bonding group 206 may be any reactive element that can bond or chemically react with a desired material layer on the substrate 102, for example a metal layer, and only weakly bond to a different material, for example a dielectric material. In case of a metal layer, in some examples, the bonding group 206 can include a thiol, a silane, a carboxylate, or a phosphonate. The chain group 204 may include a chain of carbon elements that are may be connected or bonded together. Although FIG. 2 illustrates one group of the SAM molecule 200, the chain group 204 may be bonded with adjacent chain groups that may form the larger SAM structure (not shown). In various embodiments, the chain group 204 may include $C_xH_y$ molecules that may be bonded together to form the three-dimensional structure of the SAM molecule 200 across the surface of the substrate 102. The terminal group 202 may be assembled above the chain group 204 and may be selected based on the application of the SAM molecule 200. Examples of the SAM molecule 200 include, but are not limited to, 1-octadecanethiol ($CH_3(CH_2)_{16}CH_2SH$), perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($(CH_3)3CSi(Cl)(CH_3)_2$)).

FIGS. 3A-3I illustrate, through schematic cross-sectional views of a substrate, a method of processing the substrate in accordance with various embodiments.

Figure 3A:
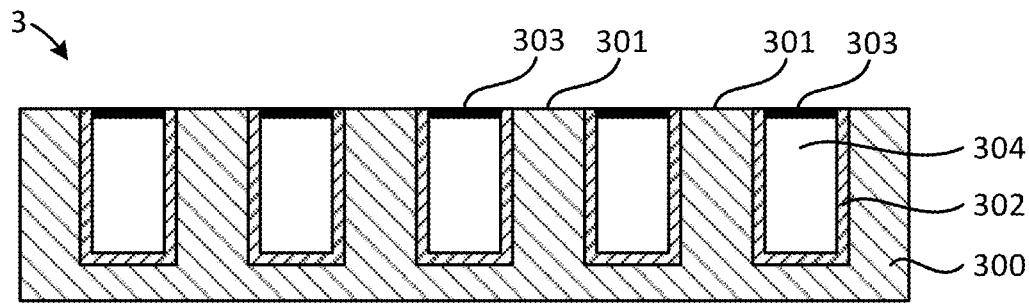

In FIG. 3A, a substrate 3 may be a part of, or include, a semiconductor device, and may have undergone a number of steps of processing following, for example, a conventional process. The substrate 3 accordingly may comprise layers of semiconductors useful in various microelectronics. For example, the semiconductor structure may comprise the substrate 3 in which various device regions are formed.

In one or more embodiments, the substrate 3 may be a silicon wafer, or a silicon-on-insulator (SOI) wafer. In certain embodiments, the substrate 3 may comprise a silicon germanium wafer, silicon carbide wafer, gallium arsenide wafer, gallium nitride wafer and other compound semiconductors. In other embodiments, the substrate 3 comprises heterogeneous layers such as silicon germanium on silicon, gallium nitride on silicon, silicon carbon on silicon, as well layers of silicon on a silicon or SOI substrate. In various embodiments, the substrate 3 is patterned or embedded in other components of the semiconductor device.

As illustrated in FIG. 3A, the substrate 3 may be patterned and contains recessed features in a first dielectric material 300, where the recessed features contain a barrier/liner layer 302 that surrounds a metal 304 on the sidewall and the bottom of the recessed features. In various embodiments, as illustrated in FIG. 3A, the surface of the substrate 3 may comprise a surface oxide 303 of the metal 304 prior to performing the methods described in this disclosure. The surface may also comprise an exposed first dielectric material surface 301. In addition, the surface of the substrate 3 may also comprise exposed edges of the barrier/line layer 302 as illustrated in FIG. 3A. In one example, the metal 304 can include a metal selected from the group consisting of Cu, Al, Ta, Ti, W, Ru, Co, Ni, and Mo. In one or more embodiments, the metal 304 may comprise more than one metals. In one example, the first dielectric material 300 comprises silicon (Si). In another example, the first dielectric material 300 comprises $SiO_2$ or a low-k material. In various embodiments, the barrier/liner layer 302 may comprise tantalum (Ta)-based materials, Ru, Co or silicon nitride (SiN)-based materials. In various embodiments, the recessed features may be used for forming a fully self-aligned via (FSAV). Accordingly, in certain embodiments, the recessed features may have a pitch size of 30 nm or less.

In various embodiments, the exemplary substrate 3 may have been planarized with the metal surface 305 and the first dielectric material surface 301 in the same horizontal plane. In certain embodiments, the planarization may utilize a chemical mechanical planarization (CMP) process, followed by a cleaning process to remove any impurities.

Figure 3B:
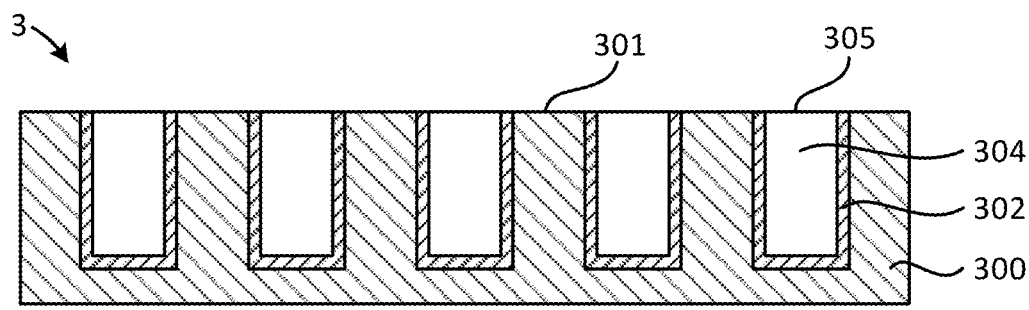

FIG. 3B illustrates a cross-sectional view of the substrate 3 after removing the surface oxide 303 to expose the metal 304.

A pretreatment may be performed to remove the surface oxide 303 so that a metal surface 305 becomes accessible for subsequent process steps. In various embodiments, the pretreatment may be a wet process. In one example, an alcohol solution may be contacted with the substrate 3 at room temperature for a predetermined time. The alcohol solution may comprise one or more alcohols or, alternatively, the alcohol solution may comprise one or more alcohols and a non-oxidizing solvent. The alcohol solution can contain any alcohol with a chemical formula R—OH. One class of alcohols is primary alcohols, of which methanol and ethanol are the simplest members. Another class of alcohols is secondary alcohols, for example isopropyl alcohol (IPA). In certain embodiments, the pretreatment may also comprise a step to remove moisture from the substrate 3. The removal of moisture may be performed, for example, by a thermal treatment under an inert gas flow. Such a thermal treatment may be performed using the anneal module 112 of the spin-coating processing system 100. The pretreatment may be performed while rotating the substrate 3 as a spin process, or as a static process. In various embodiments, the pretreatment may be performed using the spin-coating processing system 100 described referring to FIG. 1.

As illustrated in FIG. 3B, after the pretreatment, the first dielectric material surface 301 and the metal surface 305 may comprise a planar surface. In other embodiments, however, after the pretreatment, the metal surface 305 may be a recessed surface below the level of the first dielectric material surface 301 as a result of the etching of the surface oxide 303. According to one embodiment, the recessed metal surface can be between about 0.3 nm and about 3 nm below the first dielectric material surface 301. In certain embodiments, the recessed metal surface may be beneficial in depositing a self-assembled monolayer (SAM) selectively on the metal surface 305 in a subsequent step. In yet another embodiment, the substrate 3 may be free from a surface oxide and the incoming substrate may already have the metal 304 exposed with the metal surface 305 as illustrated in FIG. 3B. In this case, a pretreatment may be skipped or performed only for the removal of moisture prior to the formation of the SAM.

Figure 3C:
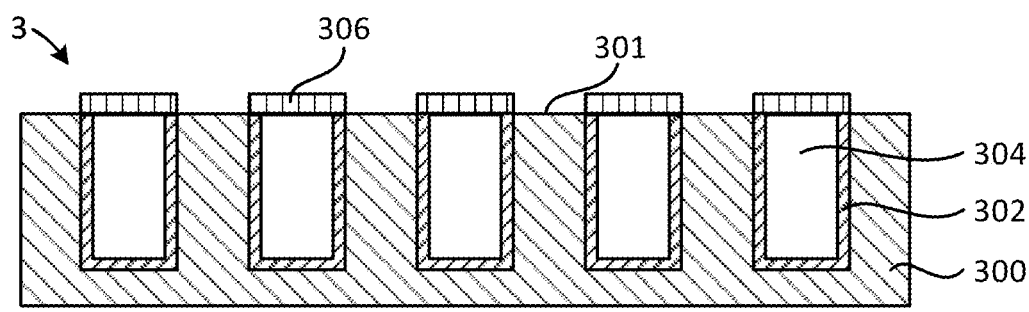

FIG. 3C illustrates a cross-sectional view of the substrate 3 after selectively forming a self-assembled monolayer (SAM) on the metal surface 305.

The method further includes, as schematically shown in FIG. 3C, selectively forming a self-assembled monolayer (SAM) 306 on the exposed metal surface 305. In various embodiments, the SAM 306 may be formed by a spin-on process using the coating module 104 of the spin-coating processing system 100 described in FIG. 1. In one or more embodiments, the SAM 306 may be formed by a vapor deposition process such as chemical vapor deposition (CVD). In case of the spin-on process, the method includes dispensing at least one chemical solution on the substrate 3 while rotating the substrate 3, where the at least one chemical solution includes at least one type of a chemical compound containing a carbon group, a bonding group coupled to the carbon group, and a terminal group coupled to the carbon group that is opposite the bonding group. The at least one chemical solution may further include a solvent, for example an organic solvent. The amount of the at least one chemical solution that is dispensed should enable at least a majority of the substrate 3 to be covered by the at least one chemical solution. In one example, a concentration of the SAM molecule in the at least one chemical solution can be about 5 mM, or less. The substrate 3 may be rotated during the application of the at least one chemical solution, for example at a rotation speed between about 800 rpm and about 2200 rpm. In various embodiments, the spin-on process to deposit the SAM may comprise repeating dispensing the chemical solution to ensure a sufficient packing density of the SAM on the metal surface 305 can be achieved.

According to certain embodiments, the at least one chemical solution includes a first chemical solution and a second chemical solution, where the dispensing includes sequentially dispensing the first chemical solution and the second chemical solution on the substrate 3. In one embodiment, the first chemical solution and the second chemical solution may include different SAM molecules so that the SAM 306 may comprise more than one type of SAM molecules. Such an embodiment may advantageously enable more complete coverage of the exposed metal surface 305, particularly if the metal 304 comprises more than one metal.

In various embodiments, the SAM 306 may have a thickness between 1 nm and 5 nm. The methods of this disclosure utilize the SAM 306 not only as a blocking layer for dielectric deposition but also a diffusion barrier layer. Accordingly, the thickness of the SAM 306 to be formed at this step may be selected such that the SAM 306 can effectively hinder material diffusion (e.g., the metal 304) during subsequent deposition steps.

The bonding group of the SAM molecule contains a reactive element (e.g., a thiol group) that can bond or chemically react with the exposed metal surface 305 of the metal 304, while only weakly interacting with the first dielectric material surface 301 of the first dielectric material 300. Thereafter, a rinsing solution (e.g., isopropyl alcohol (IPA)) may be dispensed by the coating module 104 on the substrate 3 to remove any excess chemical solution from the substrate 3, including any weakly bound SAM molecules from the first dielectric material surface 301 of the first dielectric material 300.

Thereafter, the substrate 3 may be removed from the coating module 104 to the anneal module 112 that may include a resistive heating element or a radiation source (e.g., UV light). In the anneal module 112, the substrate 3 may be annealed at a temperature that is below the desorption temperature and the degradation temperature of the SAM on the exposed metal surface 305. In one example, using SAM molecules of 1-octadecanethiol, the substrate 3 may be annealed at a temperature of less than 160° C. (the degradation temperature of 1-octadecanethiol), for a time period of about 5 minutes, or less. In other embodiments, the substrate 3 may be removed from the system 100 and annealed in a separate tool (e.g., bake oven, furnace, etc.). The annealing may enable or improve the self-assembly of the SAM molecules components on the exposed metal surface 305 of the metal 304. Thereafter, the substrate 3 may be transferred to the coating module 104 for additional rinsing, followed by a soft bake in the anneal module 112. The soft bake may be performed at a temperature of less than 160° C. This series of steps selectively forms an ordered SAM 306 on the metal surface 305, while the first dielectric material surface 301 remains at least substantially free of the SAM molecules.

According to one embodiment, the sequential steps of dispensing at least one chemical solution on the substrate 3 while rotating the substrate 3, annealing the substrate 3 following the dispensing the at least one chemical solution on the substrate 3, and dispensing a rinsing solution on the substrate 3, may be repeated at least once to improve the coverage and the quality of the SAM 306 on the metal surface 305.

The characteristics of the SAM 306 may include uniform thickness distribution on the metal surface 305 across the substrate 3 and/or a uniform water contact angle appropriate to the terminal group of the SAM 306. The SAM 306 can act as a blocking layer for subsequent film deposition and further protects the metal surface 305 against adverse effects such as oxidation and also metal diffusion of the metal 304 during subsequent layer formation steps.

Figure 3D:
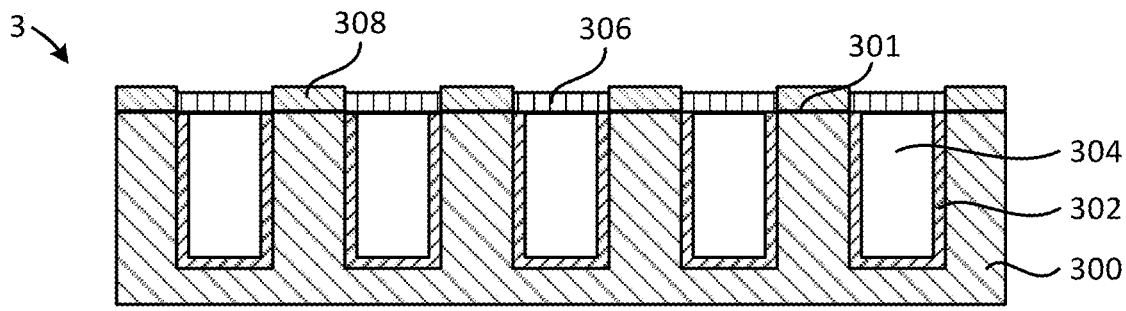

FIG. 3D illustrates a cross-sectional view of the substrate 3 after depositing a second dielectric material 308 on the first dielectric material 300.

The method further includes, as schematically shown in FIG. 3D, depositing a second dielectric material 308 selectively on the exposed first dielectric material surface 301, where the SAM 306 hinders deposition of the second dielectric material 308 on the metal surface 305. The second dielectric material 308 may comprise $Al_2O_3$, $SiO_2$, SiON, $Al_2O_3/SiO_2$, or SiOCN. In various embodiments, the depositing may be performed using a vapor deposition technique such as chemical vapor deposition (CVD), physical vapor deposition (PVD), and atomic layer deposition (ALD), as well as other plasma processes such as plasma enhanced CVD (PECVD), sputtering, and other processes. In one or more embodiments, the deposition of the second dielectric material 308 may be performed by exposing the substrate 3 to a metal precursor (e.g., Al-containing precursor) and oxidants to form dielectric on dielectric (DoD) surface.

According to one embodiment, the depositing includes adsorbing a metal-containing catalyst layer on the first dielectric material surface 301, and in the absence of any oxidizing and hydrolyzing agent, at a substrate temperature of approximately 150° C., or less, exposing the substrate to a process gas containing a silanol gas to deposit a $SiO_2$ film. For example, the silanol gas may be selected from the group consisting of tris(tert-pentoxy) silanol, tris(tert-butoxy) silanol, and bis(tert-butoxy)(isopropoxy) silanol. The metal-containing catalyst layer can, for example, include aluminum (Al) or titanium (Ti). In one example, the metal-containing catalyst layer may be formed by exposing the substrate to $AlMe_3$ gas. In one example, the silanol gas is selected from the group consisting of tris(tert-pentoxy) silanol, tris(tert-butoxy) silanol, and bis(tert-butoxy)(isopropoxy) silanol.

According to one embodiment, deposition of the second dielectric material 308 may further deposit an unwanted additional dielectric film (not shown) on the metal surface 305 due to imperfections in the coverage of the SAM 306. In one example, the additional dielectric film can form an overhang over the metal surface 305. In order to address this unwanted deposition, the method can further include removing or shaping (trimming) the additional dielectric film from the metal surface 305 to improve the selectivity of the formation of the second dielectric material 308 on the first dielectric material surface 301 and not on the metal surface 305. In one example, atomic layer etching (ALE) using sequential gaseous exposures of HF and $Al(CH_3)_3$ may be used to etch an additional dielectric film containing $SiO_2$.

After the DoD deposition, instead of removing the SAM 306, it can be left in place to function as a diffusion barrier layer in subsequent processing and as an etch stop layer (ESL). By depositing the SAM 306 before selectively depositing DoD, no conformal diffusion barrier layer deposition may be needed after the DoD line formation.

While the step of forming an additional barrier layer may be advantageously eliminated due to the SAM 306 remaining in place after the DoD line formation, in other embodiments, the additional barrier layer may still be used together with the SAM 306. In such embodiments, a conformal layer may be formed over the second dielectric material 308 and the SAM 306. The presence of the SAM 306 after the DoD line formation may supplement the function of the barrier layer, and thereby the thickness requirement for the additional barrier layer may be relaxed compared to the case without SAM.

In various embodiments, subsequent process steps following the DoD line formation (e.g., FIG. 3D) may comprise additional layer formation and their patterning for fully self-aligned vias (FSAV) formation followed by metallization as a part of a back-end-of-line (BEOL) fabrication process. One exemplary process flow to form vias and line recesses is described below referring to FIG. 3E-3I, but other process flows may also be possible. It will be appreciated that any suitable features might be formed, including (whether or not considered "recesses") holes, trenches, and/or other suitable structures, using embodiments of this disclosure.

Figure 3E:
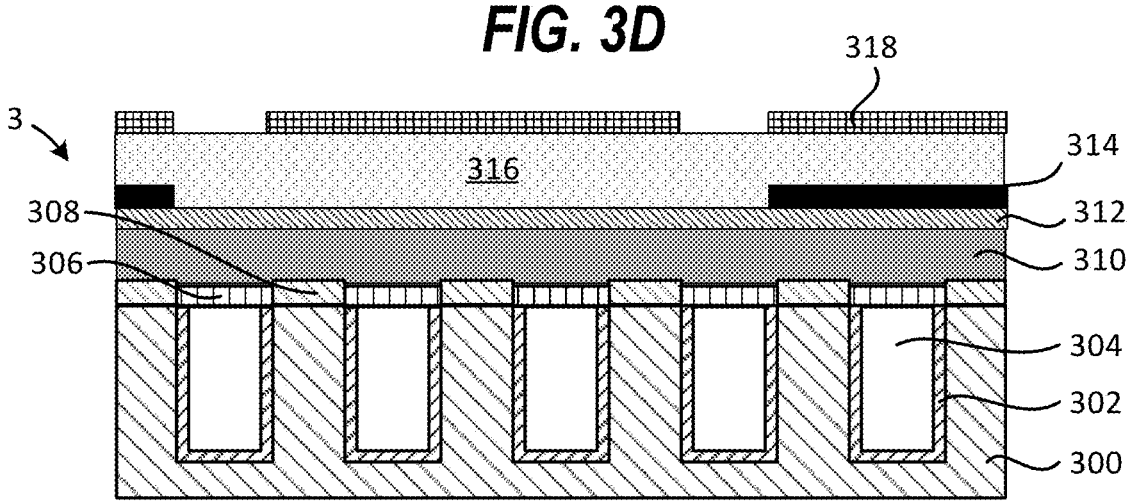

FIG. 3E illustrates a cross-sectional view of the substrate 3 after forming a layer stack comprising an interlayer dielectric (ILD) 310 for subsequent patterning.

In FIG. 3E, the layer stack may be formed over the substrate 3 to enable fully self-aligned vias (FSAV) formation. First, the ILD 310 may be formed over the SAM 306 and the second dielectric material 308. In various embodiments, ILD 310 comprises a third dielectric material and may be deposited by flowable-CVD, followed by planarization. Over the ILD 310, as illustrated in FIG. 3E, the layer stack may further comprise an etch stop layer (ESL) 312, a patterned first hardmask 314, a planarizing layer 316, and a patterned second hardmask 318. In various embodiments, one or more conventional photolithographic processes may be used to pattern layers of the first hardmask 314 and the second hardmask 318. The patterned first hardmask 314 may define a first relief pattern to be transferred into the ILD 310 for forming line recesses or trenches. The patterned second hardmask 318 may define a second relief pattern to be transferred into the ILD 310 for forming vias.

Figure 3F:
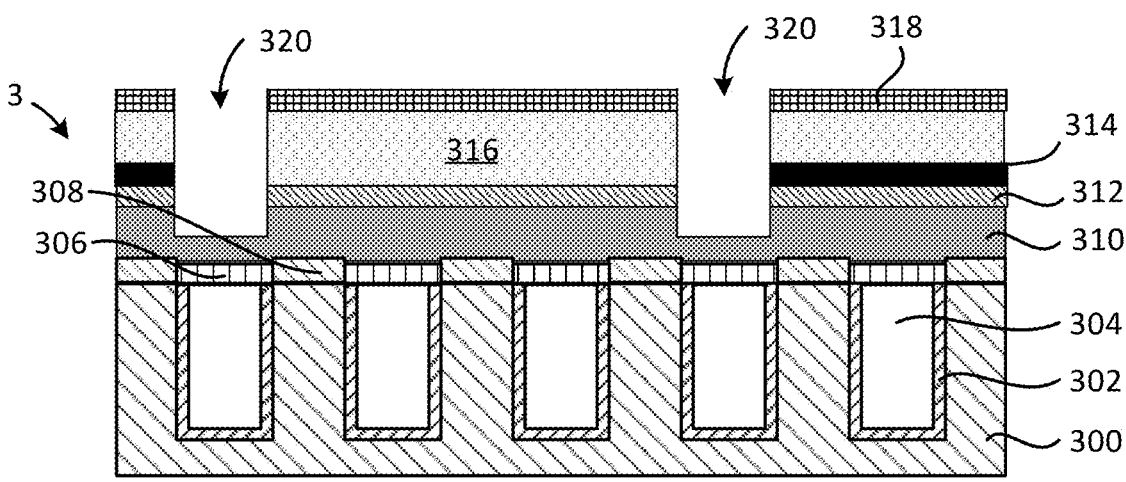

FIG. 3F illustrates a cross-sectional view of the substrate 3 after a first pattern transfer etch.

In various embodiments, the pattern of the patterned second hardmask 318 may be first transferred into the ILD 310 by etching through the layer stack including the ILD 310 selectively to the patterned second hardmask 318 and the second dielectric material 308, forming vias 320. Anisotropic etch techniques such as a reactive ion etch (RIE) may be used. In certain embodiments, the first pattern transfer etch may be timed such that the vias 320 may only be extended into a portion of the ILD 310. Alternately, the vias 320 may be extended to expose the SAM 306.

Figure 3G:
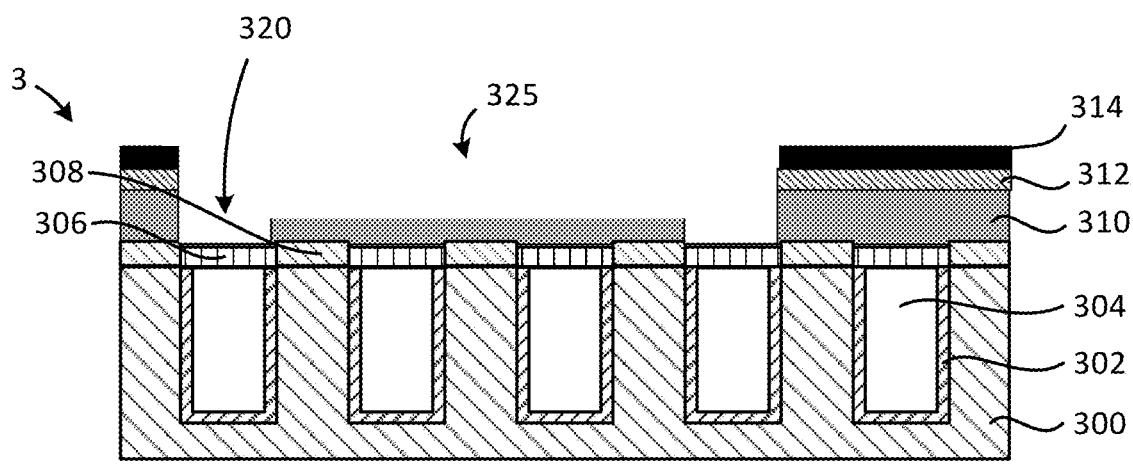

FIG. 3G illustrates a cross-sectional view of the substrate 3 after a second pattern transfer etch.

In various embodiments, the pattern of the patterned first hardmask 314 may be transferred into the ILD 310 by etching through the layer stack including the ILD 310 selectively to the patterned first hardmask 314 the second dielectric material 308, forming line recesses 325. Anisotropic etch techniques such as a reactive ion etch (RIE) may be used. As illustrated in FIG. 3G, the planarizing layer 316 and the patterned second hardmask 318 have been removed by the second pattern transfer etch or another etch process. After the two pattern transfer etch processes, the ILD 310 is patterned to have two features: the vias 320 and the line recesses 325. In certain embodiments, the second pattern transfer etch may extend the vias 320 formed during the first transfer etch to reach the bottom of the ILD 310 and expose the SAM 306, while the line recesses 325 may only be extended into a portion of the ILD 310 such that subsequent metallization can form interconnects between circuit elements of the substrate 3. Although the SAM 306 is illustrated at the bottom of the vias 320 in FIG. 3G, the pattern transfer etch processes may also remove a part of or all of the SAM 306.

Figure 3H:
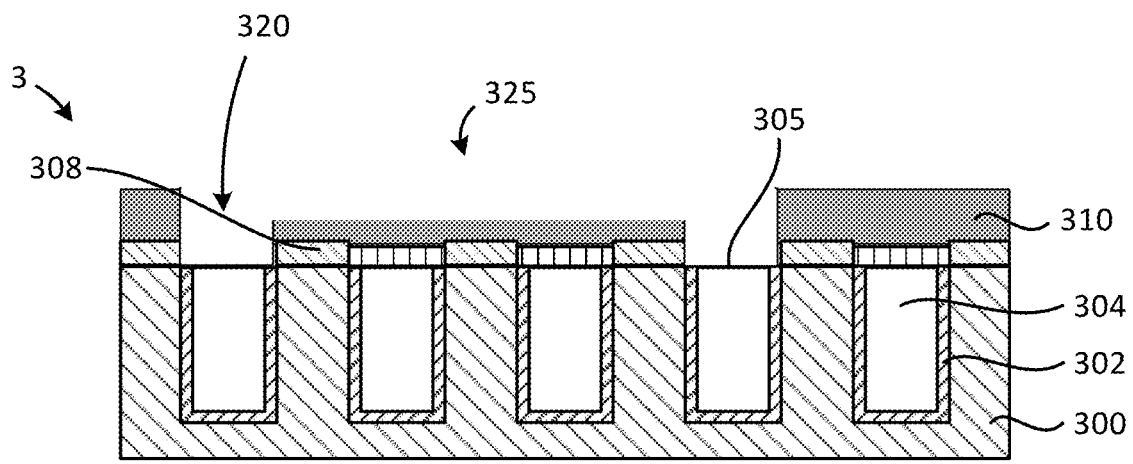

FIG. 3H illustrates a cross-sectional view of the substrate 3 after removing the SAM 306 and remaining layers.

In certain embodiments, where the SAM 306 is still present at the bottom of the vias 320 after the second pattern transfer etch, an additional step may be performed to remove the SAM 306 as well as any remaining layers of the patterned first hardmask 314 and the ESL 312. As a result, the metal surface 305 may be exposed again, but only at the bottom of the vias 320 where the interconnects are to be formed. In other embodiments, any remaining portion of the SAM 306 may be removed at any other stage of the process.

Figure 3I:
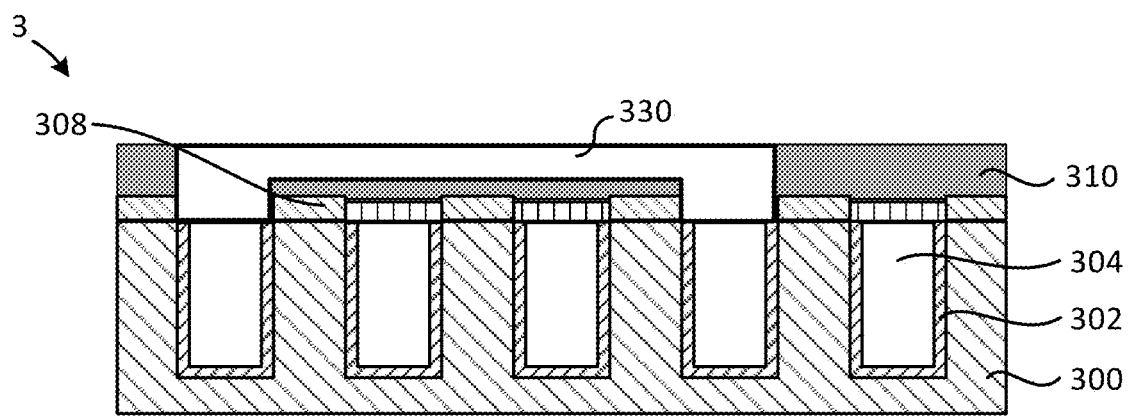

FIG. 3I illustrates a cross-sectional view of the substrate 3 after metallization.

Lastly, the vias 320 and line recesses 325 may be filled with a conductive fill 330 by a metallization process. In various embodiments, the conductive fill 330 may comprise Cu, Al, Ta, Ti, W, Ru, Co, Ni, or Mo. In certain embodiments, the conductive fill 330 may be the same as the metal 304. In one or more embodiments, the metallization may be performed by a seed layer deposition of a metal (e.g., copper) using a sputtering or physical vapor deposition (PVD) technique followed by electroplating. Additionally, a planarization may be performed using a chemical mechanical planarization (CMP) method.

Figure 4A:
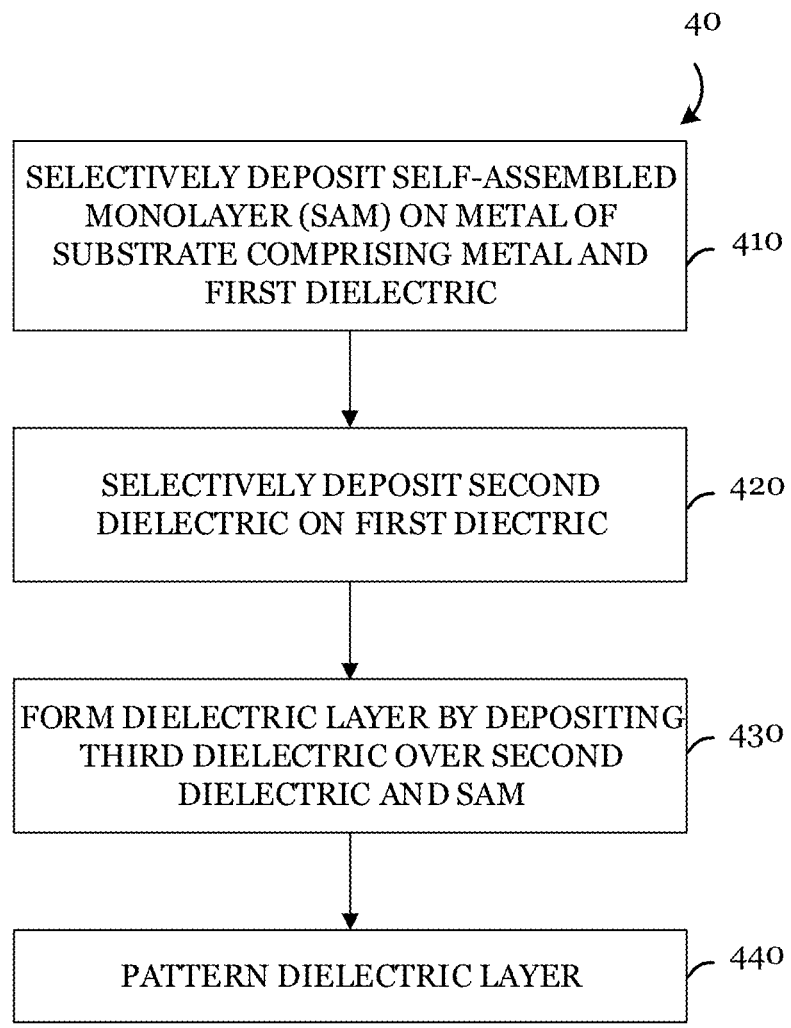
Figure 4B:
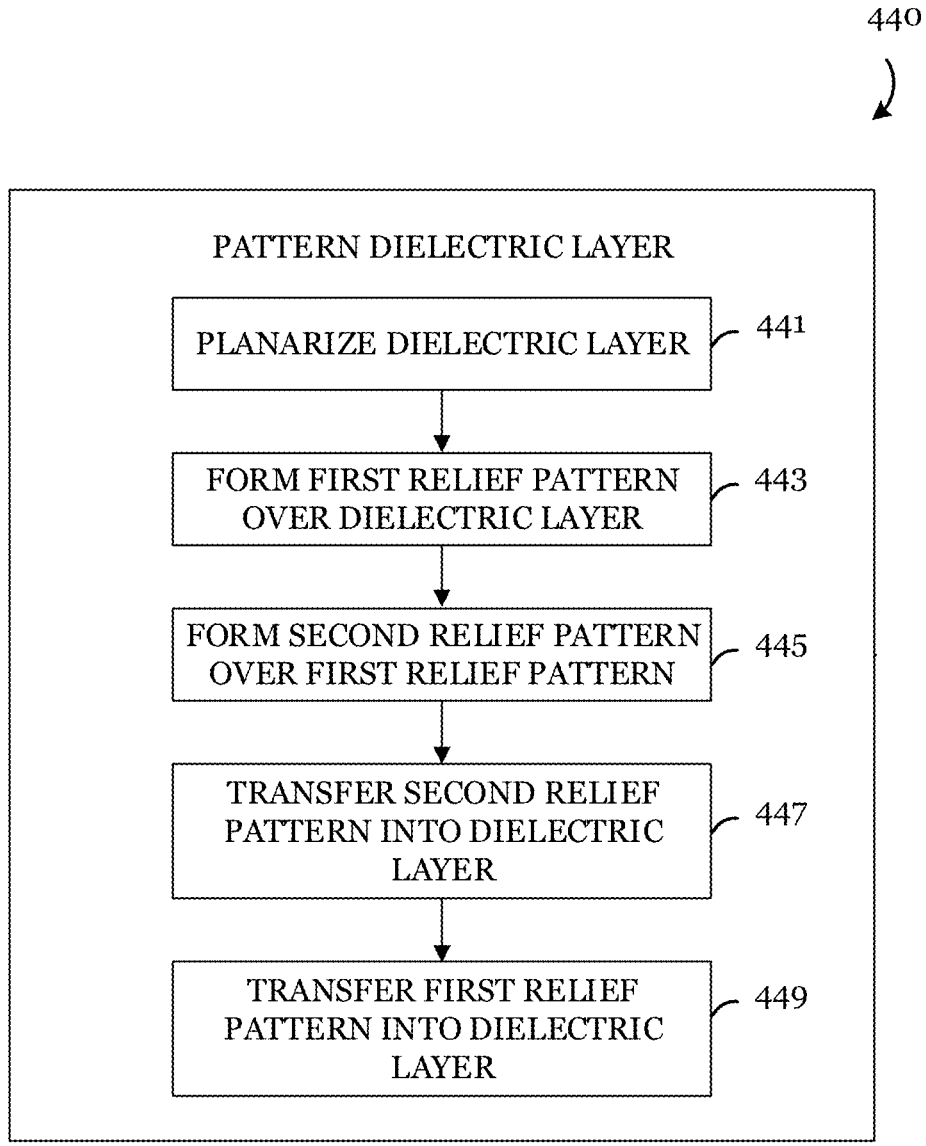
Figure 4C:
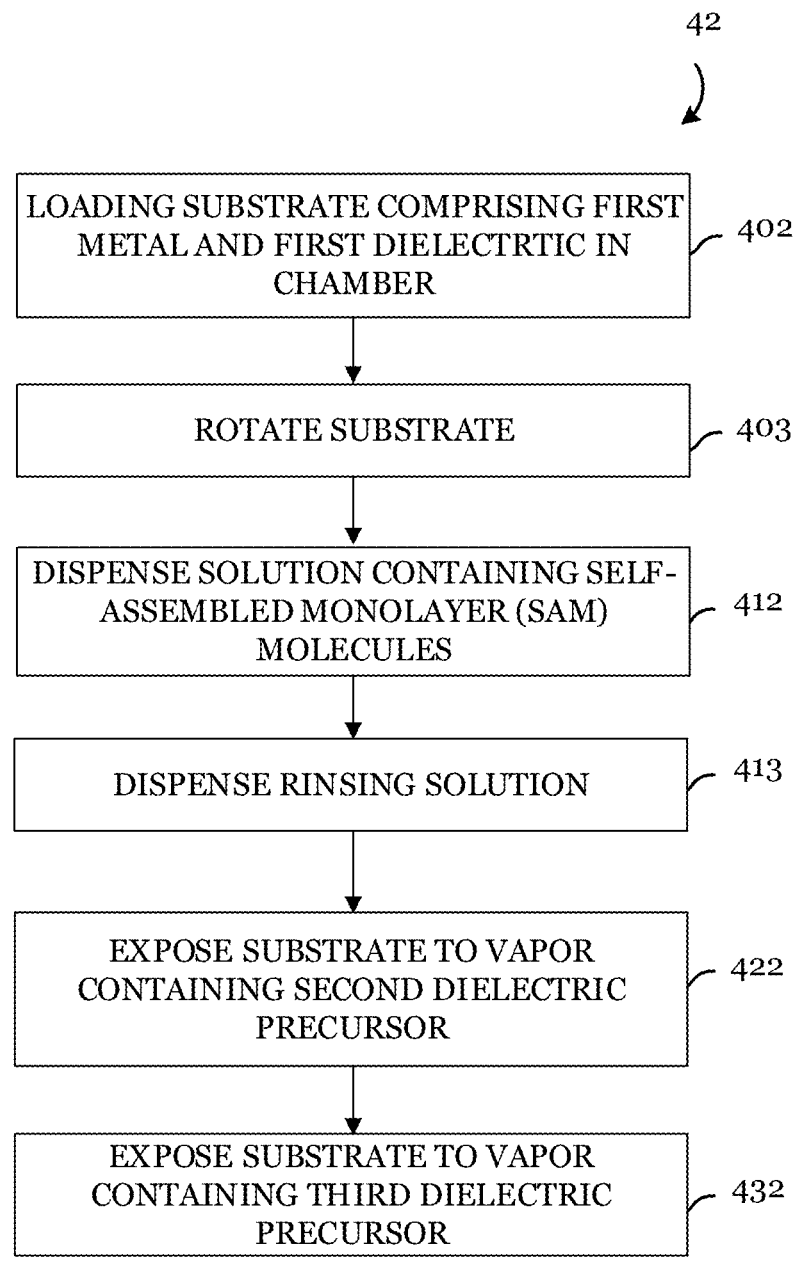
Figure 4D:
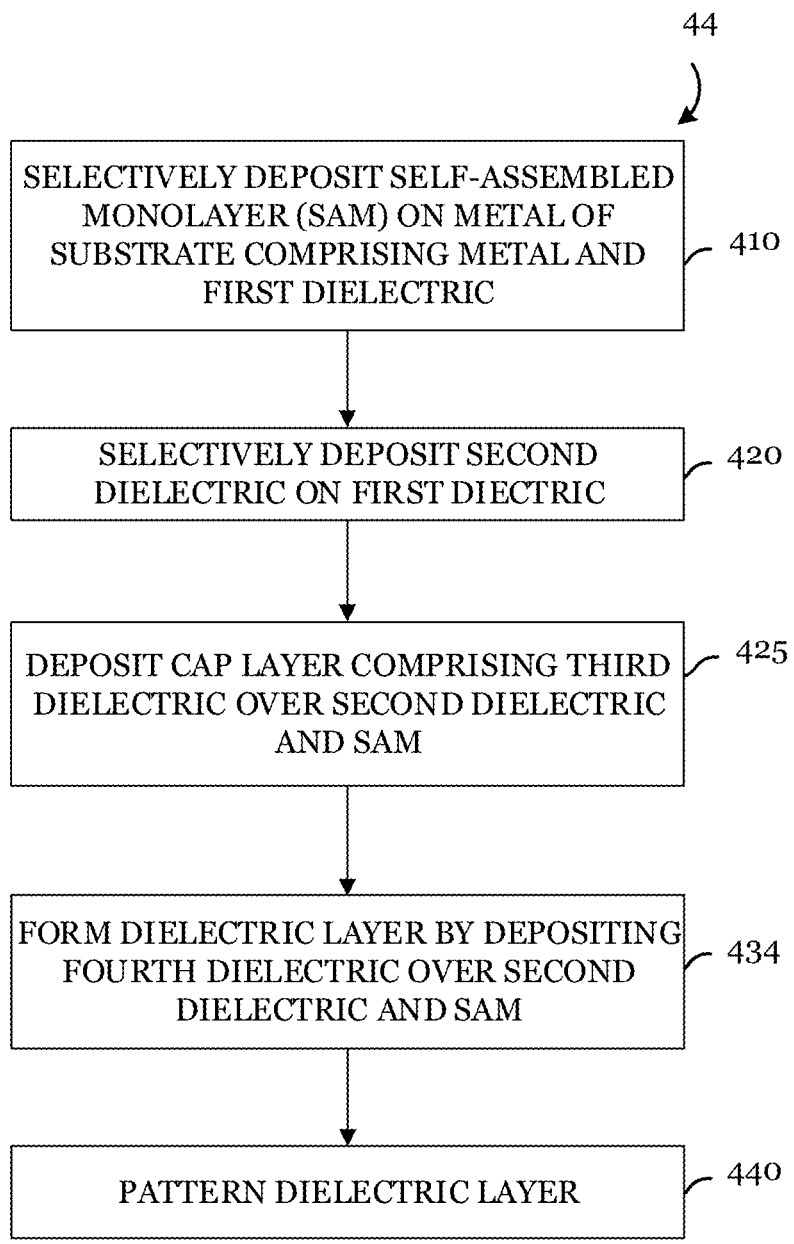

FIG. 4A-4D illustrate example process flow diagrams in accordance with various embodiments, wherein FIG. 4A illustrates an embodiment, FIG. 4B illustrates steps for patterning an interlayer dielectric (ILD) after SAM formation in accordance with an embodiment, FIG. 4C illustrates another embodiment, and FIG. 4D illustrates yet another embodiment. The process flows can be followed with the figures (FIG. 3A-3I) discussed above and hence will not be described again.

In FIG. 4A, a process flow 40 starts with selectively depositing a self-assembled monolayer (SAM) on a metal of a substrate, where the substrate comprises the metal and a first dielectric material (block 410, FIG. 3C). Next, a second dielectric material may then be deposited selectively on the first dielectric material, wherein the SAM hinders deposition of the second dielectric material over the metal surface (block 420, FIG. 3D). Subsequently, a dielectric layer may be formed by depositing a third dielectric material over the second dielectric material and the SAM (block 430, FIG. 3E), followed by patterning the dielectric layer (block 440, FIGS. 3F-3H).

In FIG. 4B, in accordance with an embodiment of FIG. 4A, process flows for patterning the dielectric layer (e.g., FIG. 3E) after forming the SAM and the dielectric layer is illustrated. The patterning process 440 may start with planarizing the dielectric layer (block 441). Next, a first relief pattern may be formed over the dielectric layer (block 443, FIG. 3E), followed by forming a second relief pattern over the first relief pattern (block 445, FIG. 3E). Subsequently, the second relief pattern may be transferred into the dielectric layer by etching through the dielectric layer selectively to the second dielectric material (block 447, FIG. 3F), and the first relief pattern may be transferred into the dielectric layer by etching through the dielectric layer selectively to the second dielectric material (block 449, FIG. 3G).

In FIG. 4C, a process flow 42 starts with loading a substrate in a processing chamber, where the substrate comprises a first metal and a first dielectric material (block 402, FIG. 3B). Selective deposition of a self-assembled monolayer (SAM) on the metal of the substrate may be performed by rotating the substrate (block 403) and dispensing a solution containing SAM molecules onto the substrate (block 412, FIG. 3C). Next, the process flow 42 proceeds to selectively depositing a second dielectric material on the first dielectric material by exposing the substrate to a vapor containing a second dielectric precursor (block 422, FIG. 3D), and then forming a dielectric layer by exposing the substrate to a third dielectric precursor (block 432, FIG. 3E).

In FIG. 4D, a process flow 44 starts with selectively depositing a self-assembled monolayer (SAM) on a metal of a substrate that comprises the metal and a first dielectric material (block 410, FIG. 3C). Next, a second dielectric material may be deposited selectively on the first dielectric material (block 420, FIG. 3D), followed by depositing a diffusion barrier layer comprising a third dielectric material over the second dielectric material and the SAM (block 425). Subsequently, a dielectric layer may be formed by depositing a fourth dielectric material over the diffusion barrier layer (block 434). The dielectric layer may then be patterned (block 440).

Example embodiments are summarized here. Other embodiments can also be understood from the entirety of the specification as well as the claims filed herein.

Example 1. A method of processing a substrate that includes: selectively depositing a self-assembled monolayer (SAM) on a metal line of the substrate, the SAM being in contact with the metal line, a surface of the substrate further including a first dielectric material that surrounds the metal line; selectively depositing a second dielectric material over the first dielectric material; forming a dielectric layer by depositing a third dielectric material over the second dielectric material and the SAM; and patterning the dielectric layer.

Example 2. The method of example 1, where the substrate further includes a metal oxide over the metal line, the method further including, prior to selectively depositing the self-assembled monolayer (SAM), performing a pretreatment to remove the metal oxide and expose the metal line.

Example 3. The method of one of examples 1 or 2, where patterning the dielectric layer further includes: planarizing the dielectric layer: forming a first relief pattern over the dielectric layer, the first relief pattern to be transferred into the dielectric layer; forming a second relief pattern over the first relief pattern, the second relief pattern to be transferred into the dielectric layer; transferring the second relief pattern into the dielectric layer by etching through the dielectric layer selectively to the second dielectric material; and transferring the first relief pattern into the dielectric layer by etching through the dielectric layer selectively to the second dielectric material.

Example 4. The method of one of examples 1 to 3, where transferring the second relief pattern forms trenches in the dielectric layer, and where transferring the second relief pattern forms vias in the dielectric layer.

Example 5. The method of one of examples 1 to 4, where patterning the dielectric layer forms fully self-aligned vias (FSAV), the method further including: after transferring the second relief pattern, removing the second relief pattern; after transferring the first relief pattern, removing the first relief pattern; and filling the trenches and the vias with a metal. 6. The method of one of examples 1 to 4, further including, prior to filling the trenches and the vias, removing uncovered portions of the self-assembled monolayer (SAM) to expose the top surfaces of the metal line.

Example 7. The method of one of examples 1 to 6, where the substrate further includes another metal line, and where filling the trenches and the vias with the metal forms an electrical connection between the metal line and the another metal line.

Example 8. The method of one of examples 1 to 7, where the first dielectric material and the third dielectric material are a same material.

Example 9. The method of one of examples 1 to 8, where the first dielectric material includes Al2O3, SiO2, SiON, or SiOCN.

Example 10. The method of one of examples 1 to 9, where the third dielectric material includes Al2O3, SiO2, SiON, or SiOCN.

Example 11. The method of one of examples 1 to 10, where the dielectric layer is in contact with the self-assembled monolayer (SAM).

Example 12. A method of processing a substrate that includes: loading a substrate in a processing chamber, the substrate including a first metal and a first dielectric material; rotating the substrate; while rotating the substrate, dispensing a solution containing self-assembled monolayer (SAM) molecules onto the substrate to deposit a SAM on the first metal, the SAM being in physical contact with the first metal; dispensing a rinsing solution onto the substrate; exposing the substrate to a vapor containing a second dielectric precursor to deposit a second dielectric material over the first dielectric material; and exposing the substrate to another vapor containing a third dielectric precursor to deposit a third dielectric material over the second dielectric material and the SAM, the third dielectric precursor and the second dielectric precursor having different compositions.

Example 13. The method of example 12, where the self-assembled monolayer (SAM) has a thickness between 1 nm and 5 nm.

Example 14. The method of one of examples 12 or 13, where the metal includes Cu, Al, Ta, Ti, W, Ru, Co, Ni, or Mo.

Example 15. The method of one of examples 12 to 14, further including repeating the dispensing of the solution and the dispensing of the rinsing solution.

Example 16. The method of one of examples 12 to 15, where the SAM molecules include a carbon group, a bonding group coupled to the carbon group, a terminal group coupled to the carbon group that is opposite the bonding group.

Example 17. The method of one of examples 12 to 16, where patterning the dielectric layer forms fully self-aligned vias (FSAV) in the dielectric layer.

Example 18. A method of processing a substrate that includes: selectively depositing a self-assembled monolayer (SAM) on a metal of the substrate to physically contact the SAM with the metal, the substrate including the metal and a first dielectric material; selectively depositing a second dielectric material over the first dielectric material; depositing a diffusion barrier layer over the second dielectric material and the SAM, the diffusion barrier layer including a third dielectric material having a different composition from the second dielectric material; forming a dielectric layer by depositing a fourth dielectric material over the diffusion barrier layer, the fourth dielectric material having a different composition than the third dielectric material; and patterning the dielectric layer.

Example 19. The method of example 18, where the third dielectric material includes SiCN.

Example 20. The method of one of examples 18 or 19, where the diffusion barrier layer is in contact with the self-assembled monolayer (SAM).

Example 21. The method of one of examples 1 to 11, where the self-assembled monolayer (SAM) is deposited by spin-on deposition.

Example 22. The method of one of examples 1 to 11, where the self-assembled monolayer (SAM) is deposited by vapor deposition.

Example 23. The method of one of examples 1 to 11, where the self-assembled monolayer (SAM) is deposited by vapor deposition and by spin-on deposition.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

selectively depositing a self-assembled monolayer (SAM) on a metal line of the substrate, the SAM being in contact with the metal line, a surface of the substrate further comprising a first dielectric material that surrounds the metal line, wherein a molecule of the SAM comprises a carbon group, a bonding group coupled to the carbon group, and a terminal group coupled to the carbon group that is opposite the bonding group;

selectively depositing a second dielectric material over the first dielectric material;

forming a dielectric layer by depositing a third dielectric material over the second dielectric material and the SAM; and patterning the dielectric layer, the patterning comprising forming a first relief pattern over the dielectric layer, the first relief pattern to be transferred into the dielectric layer, forming a second relief pattern over the first relief pattern, the second relief pattern to be transferred into the dielectric layer, transferring the second relief pattern into the dielectric layer by etching through the dielectric layer selectively to the second dielectric material, and transferring the first relief pattern into the dielectric layer by etching through the dielectric layer selectively to the second dielectric material.

2. The method of claim 1, wherein the substrate further comprises a metal oxide over the metal line, the method further comprising, prior to selectively depositing the self-assembled monolayer (SAM), performing a pretreatment to remove the metal oxide and expose the metal line.

3. The method of claim 1, wherein patterning the dielectric layer further comprises:
planarizing the dielectric layer.

4. The method of claim 3, wherein transferring the first relief pattern forms trenches in the dielectric layer, and wherein transferring the second relief pattern forms vias in the dielectric layer.

5. The method of claim 4, wherein patterning the dielectric layer forms fully self-aligned vias (FSAV), the method further comprising:
after transferring the second relief pattern, removing the second relief pattern;
after transferring the first relief pattern, removing the first relief pattern; and
filling the trenches and the vias with a metal.

6. The method of claim 5, further comprising, prior to filling the trenches and the vias, removing uncovered portions of the self-assembled monolayer (SAM) to expose top surfaces of the metal line.

7. The method of claim 5, wherein the substrate further comprises another metal line, and wherein filling the trenches and the vias with the metal forms an electrical connection between the metal line and the another metal line.

8. The method of claim 1, wherein the first dielectric material and the third dielectric material are a same material.

9. The method of claim 1, wherein the first dielectric material comprises $Al_2O_3$, $SiO_2$, SiON, or SiOCN.

10. The method of claim 1, wherein the third dielectric material comprises $Al_2O_3$, $SiO_2$, SiON, or SiOCN.

11. The method of claim 1, wherein the dielectric layer is in contact with the self-assembled monolayer (SAM).

12. A method of processing a substrate, the method comprising:
loading a substrate in a processing chamber, the substrate comprising a first metal and a first dielectric material;
rotating the substrate;
while rotating the substrate, dispensing a solution containing self-assembled monolayer (SAM) molecules onto the substrate to deposit a SAM on the first metal, the SAM being in physical contact with the first metal;
dispensing a rinsing solution onto the substrate;
exposing the substrate to a vapor containing a second dielectric precursor to deposit a second dielectric material over the first dielectric material; and
exposing the substrate to another vapor containing a third dielectric precursor to deposit a third dielectric material over the second dielectric material and the SAM, the third dielectric precursor and the second dielectric precursor having different compositions.

13. The method of claim 12, wherein the self-assembled monolayer (SAM) has a thickness between 1 nm and 5 nm.

14. The method of claim 12, wherein the first metal comprises Cu, Al, Ta, Ti, W, Ru, Co, Ni, or Mo.

15. The method of claim 12, further comprising repeating the dispensing of the solution and the dispensing of the rinsing solution.

16. The method of claim 12, wherein the SAM molecules comprise a carbon group, a bonding group coupled to the carbon group, and a terminal group coupled to the carbon group that is opposite the bonding group.

17. The method of claim 12, further comprising patterning the second and the third dielectric materials to form fully self-aligned vias (FSAV) in the second and the third dielectric materials.

18. A method of processing a substrate, the method comprising:
selectively depositing a self-assembled monolayer (SAM) on a metal of the substrate to physically contact the SAM with the metal, the substrate comprising the metal and a first dielectric material;
selectively depositing a second dielectric material over the first dielectric material;
depositing a diffusion barrier layer over the second dielectric material and the SAM, the diffusion barrier layer comprising a third dielectric material having a different composition from the second dielectric material;
forming a dielectric layer by depositing a fourth dielectric material over the diffusion barrier layer, the fourth dielectric material having a different composition than the third dielectric material; and
patterning the dielectric layer.

19. The method of claim 18, wherein the third dielectric material comprises SiCN.

20. The method of claim 18, wherein the diffusion barrier layer is in contact with the self-assembled monolayer (SAM).

* * * * *